US012787185B2

(12) United States Patent
Kim et al.

(10) Patent No.: US 12,787,185 B2
(45) Date of Patent: Nov. 3, 2026

(54) DISPLAY APPARATUS

(71) Applicant: SAMSUNG ELECTRONICS CO., LTD., Suwon-si (KR)

(72) Inventors: Dowan Kim, Suwon-si (KR); Kiwoong Kim, Suwon-si (KR); Yoonah Kim, Suwon-si (KR); Chiun Park, Suwon-si (KR); Kwangsung Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 80 days.

(21) Appl. No.: 19/033,320

(22) Filed: Jan. 21, 2025

(65) Prior Publication Data

US 2025/0168995 A1 May 22, 2025

Related U.S. Application Data

(63) Continuation of application No. PCT/KR2023/009208, filed on Jun. 30, 2023.

(30) Foreign Application Priority Data

Aug. 31, 2022 (KR) ........................ 10-2022-0110357

(51) Int. Cl.
*H05K 5/02* (2006.01)
*H05K 5/30* (2025.01)

(52) U.S. Cl.
CPC ......... *H05K 5/0214* (2022.08); *H05K 5/0217* (2013.01); *H05K 5/30* (2025.01)

(58) Field of Classification Search
None
See application file for complete search history.

(56) References Cited

U.S. PATENT DOCUMENTS 9,357,673 B2 * 5/2016 Chin .................. H05K 7/20972
9,990,005 B2 * 6/2018 An ..................... G02B 27/0172
(Continued)

FOREIGN PATENT DOCUMENTS

CN 103544897 A 1/2014
CN 203787040 U 8/2014
(Continued)

OTHER PUBLICATIONS

International Search Report (PCT/ISA/210) issued Oct. 19, 2023 by the International Searching Authority in International Patent Application No. PCT/KR2023/009208.
(Continued)

*Primary Examiner* — Xanthia C Relford
(74) *Attorney, Agent, or Firm* — Sughrue Mion, PLLC

(57) ABSTRACT

Disclosed is a display apparatus including a display module including a substrate on which a plurality of light-emitting diodes (LEDs) are mounted, a cabinet configured to support the display module, and a circuit case coupled to the cabinet, the circuit case including electrical components. The display module includes a connector electrically connecting the display module and the electrical components; a waterproof rib configured to surround the connector and spaced from the connector; a sealing member configured to surround the connector and to seal between the display module and the circuit case in response to the display module being coupled to the circuit case; and a drainage hole formed on a lower portion of the waterproof rib.

13 Claims, 10 Drawing Sheets

(56) References Cited

U.S. PATENT DOCUMENTS

| | | | | |
|---|---|---|---|---|
| 10,314,188 | B2 | 6/2019 | Nihei | |
| 10,761,800 | B2 * | 9/2020 | Seo | G06F 3/1446 |
| 10,803,786 | B2 | 10/2020 | Yoon et al. | |
| 11,917,770 | B2 | 2/2024 | Kim et al. | |
| 2007/0188675 | A1 * | 8/2007 | Tsubokura | G02F 1/133308 349/58 |
| 2010/0246157 | A1 * | 9/2010 | Kurahashi | H05K 5/0212 361/829 |
| 2013/0163200 | A1 * | 6/2013 | Takahashi | H05K 7/20972 361/695 |
| 2013/0171921 | A1 * | 7/2013 | Nakamichi | H05K 7/20972 454/184 |
| 2020/0340585 | A1 | 10/2020 | Li et al. | |

FOREIGN PATENT DOCUMENTS

| | | | |
|---|---|---|---|
| CN | 110660332 | A | 1/2020 |
| CN | 111145654 | A | 5/2020 |
| CN | 210777644 | U | 6/2020 |
| CN | 113242668 | A | 8/2021 |
| JP | 2002-40966 | A | 2/2002 |
| JP | 2010-156838 | A | 7/2010 |
| JP | 2012-68643 | A | 4/2012 |
| JP | 2013-134418 | A | 7/2013 |
| KR | 10-2013-0088683 | A | 8/2013 |
| KR | 10-1487904 | B1 | 2/2015 |
| KR | 10-1712620 | B1 | 3/2017 |
| KR | 10-2017-0115408 | A | 10/2017 |
| KR | 10-1917075 | B1 | 11/2018 |
| KR | 10-1986967 | B1 | 6/2019 |
| KR | 10-2087431 | B1 | 3/2020 |
| KR | 10-2207491 | B1 | 1/2021 |
| KR | 10-2461712 | B1 | 11/2022 |
| KR | 10-2024-0009310 | A | 1/2024 |

OTHER PUBLICATIONS

Written Opinion (PCT/ISA/237) issued Oct. 19, 2023 by the International Searching Authority in International Patent Application No. PCT/KR2023/009208.

Communication dated Sep. 1, 2025, issued by the European Patent Office in European Application No. 23860636.2.

Communication dated Apr. 13, 2026, issued by the Korean Ministry of Intellectual Property in Korean Application No. 10-2022-0110357.

* cited by examiner

DISPLAY APPARATUS

CROSS-REFERENCE TO RELATED APPLICATIONS

This application is a continuation application of International Application No. PCT/KR2023/009208, filed on Jun. 30, 2023, which claims priority to Korean Patent Application No. 10-2022-0110357, filed on Aug. 31, 2022, in the Korean Intellectual Property Office, the disclosures of which are incorporated by reference herein in their entireties.

BACKGROUND

1. Field

The disclosure relates to a display apparatus including a plurality of display modules and a cabinet supporting the plurality of display modules.

2. Description of Related Art

A display apparatus is a type of output device that converts acquired or stored electrical information into visual information and displays such information to a user.

The display apparatus may include a plurality of display modules and a cabinet that supports the plurality of display modules by continuously tiling them in the up, down, left and right directions to achieve a large screen. The cabinets supporting the plurality of display modules may be provided in a plurality, and the plurality of cabinets may also be provided to be continuously tiled in the up, down, left and right directions as the plurality of display modules. The plurality of display modules supported by the plurality of cabinets may form a single large-sized screen.

SUMMARY

Provided is a display apparatus capable of draining water entering the display apparatus.

Further, provided is a display module that minimizes a waterproof area of a display apparatus.

Further, provided is a display module capable of minimizing a flow rate entering a waterproof area.

Further, provided is a display module including a structure for dispersing a flow rate reaching the display module positioned below.

Additional aspects will be set forth in part in the description which follows and, in part, will be apparent from the description, or may be learned by practice of the presented embodiments.

According to an aspect of the disclosure, a display apparatus includes: a display module including a substrate and a plurality of light-emitting diodes (LEDs) mounted on the substrate; a cabinet configured to support the display module; and a circuit case coupled to the cabinet, wherein the display module includes: a connector electrically connecting the display module and the circuit case; a waterproof rib around the connector and spaced apart from the connector; a sealing member around the connector and configured to seal between the display module and the circuit case in a state in which the display module is coupled to the circuit case; and a drainage hole in a lower portion of the waterproof rib.

The waterproof rib may include: a first waterproof rib; and a second waterproof rib positioned on an inner side of the first waterproof rib, and the display module may include a waterproof groove between the first waterproof rib and the second waterproof rib.

The display module may include a sealing groove between the second waterproof rib and a third waterproof rib and spaced apart from an inner side of the second waterproof rib, the sealing groove receiving the sealing member.

The waterproof groove may be deeper than the sealing groove.

The first waterproof rib may include a first drainage hole on a first lower portion of the first waterproof rib and configured to discharge water flowing along the waterproof groove, and the second waterproof rib may include a second drainage hole on a second lower portion of the second waterproof rib and configured to discharge the water flowing along the sealing groove.

The second drainage hole may be spaced apart from the first drainage hole in an up-and-down direction and a left-and-right direction.

The display apparatus may further include a guide rib configured to guide water to be dispersed.

The guide rib may include: a first guide rib extending in a left-and-right direction and configured to guide the water in the left-and-right direction; and a second guide rib perpendicular to the first guide rib, extending in an up-and-down direction, and configured to guide the water in the up-and-down direction.

The first guide rib may be spaced apart from the drainage hole and configured to guide the water discharged from the drainage hole in the left-and-right direction, and the second guide rib may be perpendicular to the first guide rib and configured to guide the water in the up-and-down direction with the first guide rib.

The guide rib may further include a third guide rib extending in an inclined direction with the first guide rib and the second guide rib.

The third guide rib may pass through a portion where the first guide rib and the second guide rib intersect.

The third guide rib may be positioned below the drainage hole to guide the water discharged from the drainage hole.

The display apparatus may further include a plurality of display modules including the display module, and the plurality of display modules are arranged in a left-and-right direction and an up-and-down direction, and are coupled to the cabinet.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
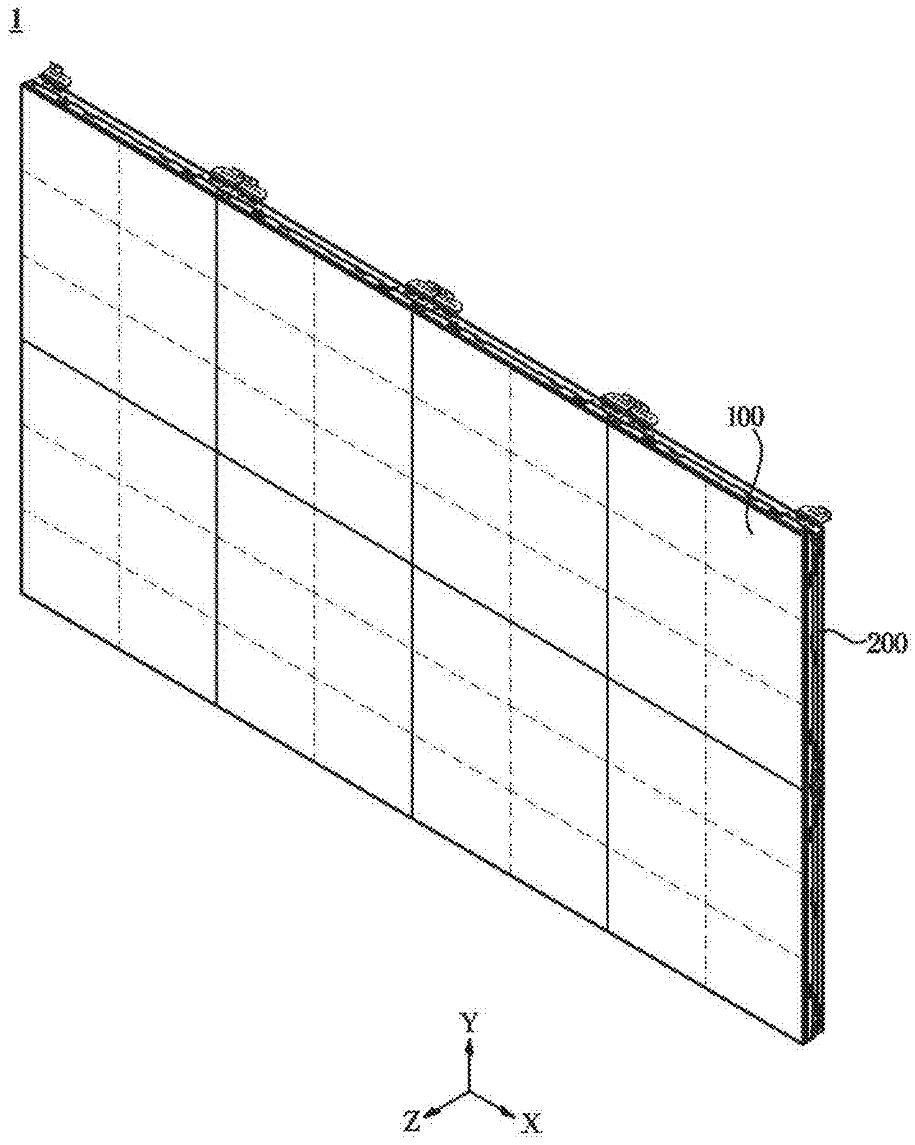
FIG. 1 is a view illustrating a display apparatus according to an embodiment.

Embodiments described in the disclosure and configurations shown in the drawings are merely examples of embodiments and may be modified in various different ways at the time of filing of the present application to replace the embodiments and drawings of the disclosure.

In connection with the description of the drawings, similar reference numerals may be used for similar or related components.

Also, the terms used herein are used to describe the embodiments and are not intended to limit and/or restrict the disclosure. The singular forms "a," "an" and "the" are intended to include the plural forms as well, unless the context clearly indicates otherwise. In this disclosure, the terms "including", "having", and the like are used to specify features, figures, steps, operations, elements, components, or combinations thereof, but do not preclude the presence or addition of one or more of the features, figures, steps, operations, elements, components, or combinations thereof.

It will be understood that, although the terms "first", "second", "primary", "secondary", etc., may be used herein to describe various elements, but elements are not limited by these terms. These terms are only used to distinguish one element from another element. For example, without departing from the scope of the disclosure, a first element may be termed as a second element, and a second element may be termed as a first element. The term of "and/or" includes a plurality of combinations of relevant items or any one item among a plurality of relevant items.

As used herein, the terms "front", "rear", "upper", "lower", "left", "right", and the like are defined with reference to the drawings and are not intended to limit the shape and location of each component.

Below, an embodiment of the disclosure will be described in detail with reference to the accompanying drawings.

FIG. 1 shows the X-axis, Y-axis, and Z-axis directions perpendicular to each other, and the X-axis direction may refer to a left-and-right direction, the Y-axis direction may refer to an up-and-down direction, and the Z-axis direction may refer to a front-to-back direction.

Below, with reference to FIGS. 1 and 2, a display apparatus 1 may be a device that displays information, materials, and data in the form of characters, shapes, graphs, images, and the like, and may be implemented as a billboard, a signboard, a screen, a television, a monitor, and the like. The display apparatus 1 may be mounted on a wall or ceiling, or may be mounted on an indoor or outdoor floor by means of a stand (not shown).

The display apparatus 1 may include a display module 100 that displays a screen, and a cabinet 200 that is coupled to a rear side of the display module 100 to support the display module 100.

In the display apparatus 1 according to an embodiment, six display modules 100 may be coupled to one cabinet 200. Two display modules 100 may be coupled along a left-and-right direction X and three display modules 100 may be coupled along the up-and-down direction Y in one cabinet 200. In other words, the display modules 100 may be combined in the cabinet 200 in a 2*3 matrix form. However, there is no limit to the number of display modules 100 that may be combined in the cabinet 200. Two or more display modules 100 may be combined in one cabinet 200.

Referring to FIG. 1, the display apparatus 1 according to an embodiment may include eight cabinets 200 and 48 display modules 100 coupled to the eight cabinets 200. As such, the display apparatus 1 may realize a large size screen by arranging a plurality of cabinets 200, to which a plurality of display modules 100 are coupled, adjacent to each other in the left-and-right direction X and the up-and-down direction Y. There is no limit to the number of cabinets 200 that are arranged adjacent to each other in the left-and-right direction X and the up-and-down direction Y, nor is there a limit to the number of display modules 100 coupled to the cabinet 200, as described above.

Figure 2:
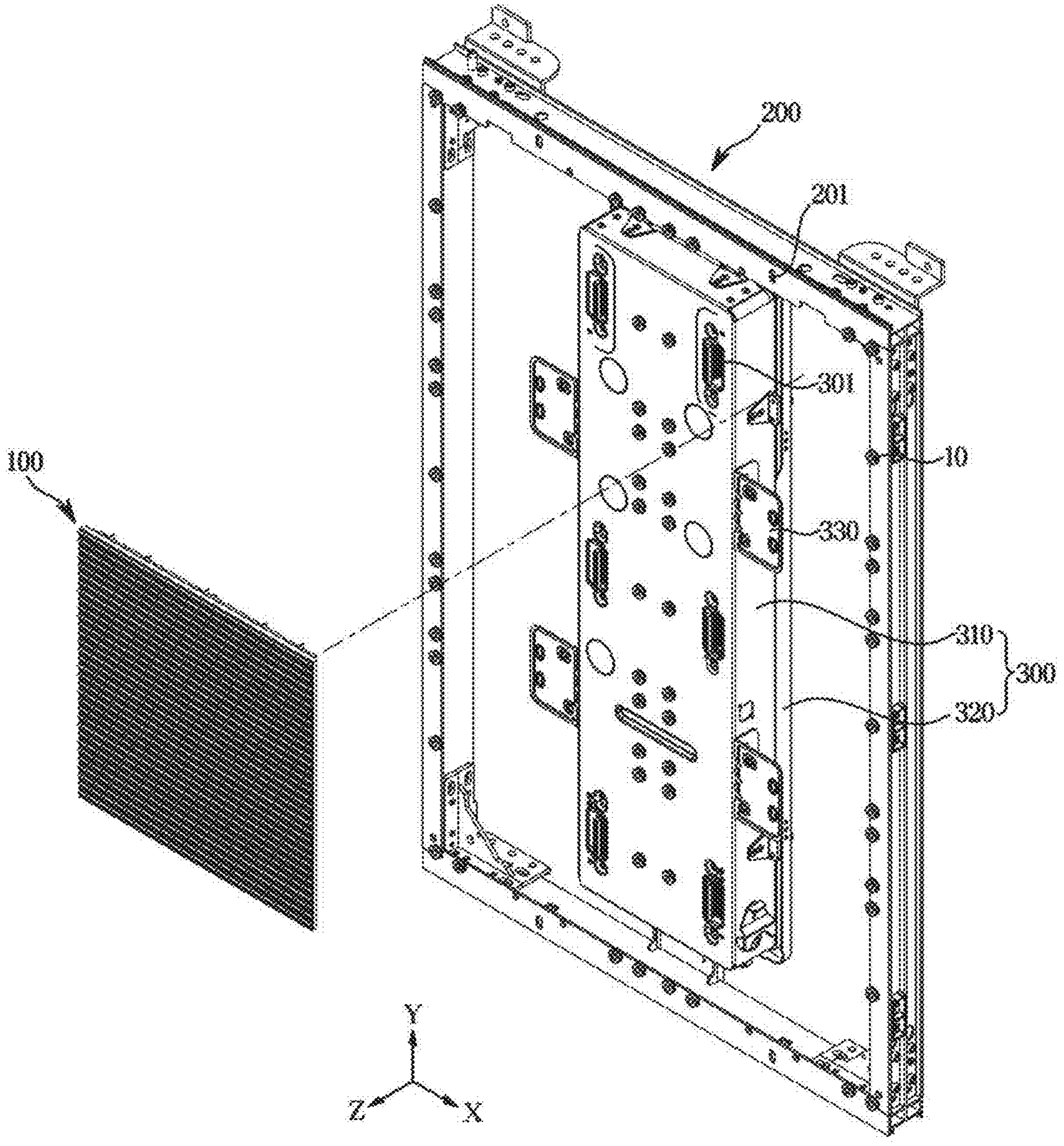
FIG. 2 is a front perspective view illustrating the display apparatus according to an embodiment, with a cabinet and a display module separated from the cabinet.

Referring to FIG. 2, the display module 100 may be detachably coupled to the cabinet 200. The display module 100 may be separated from the cabinet 200 toward a front side of the cabinet 200. The display module 100 may be coupled to the cabinet 200 by a magnetic force. The cabinet 200 may include a plurality of magnets 10 arranged on a front surface thereof. The display module 100 may include a reinforcing member 140 (see FIG. 5) arranged on a rear surface thereof and coupled to the plurality of magnets 10 by magnetic attraction. The cabinet 200 may be configured to support the display module 100.

The cabinet 200 may include frames 210, 220, 230 and 240 (see FIG. 6) forming an outer border of the cabinet 200 and a circuit case 300 arranged on an inner side of the frames 210, 220, 230 and 240. The circuit case 300 may include a second connector 301 corresponding to a first connector 112 (see FIG. 5) included in each of the plurality of display modules 100. The circuit case 300 may include a first case 310 having a hexahedral shape with an open side, and a second case 320 configured to cover the open side of the first case 310.

The plurality of display modules 100 may be electrically connected to each other by connecting the first connector 112 of each of the plurality of display modules 100 and the respective second connector 301 of the circuit case 300. In addition, the plurality of display modules 100 may receive power from a power supply arranged within the circuit case 300.

The circuit case 300 may include electrical components (not shown) therein. The electrical components (not shown) may include a control board (not shown), a power supply (not shown), and the like. The circuit case 300 may be connected to the cabinet 200. The circuit case 300 may be electrically connected to the display module 100, which is connected to the cabinet 200. The display apparatus 1 may include the display module 100, the cabinet 200 to which the display module is connected, and the circuit case 300 connected to the cabinet 200.

Figure 3:
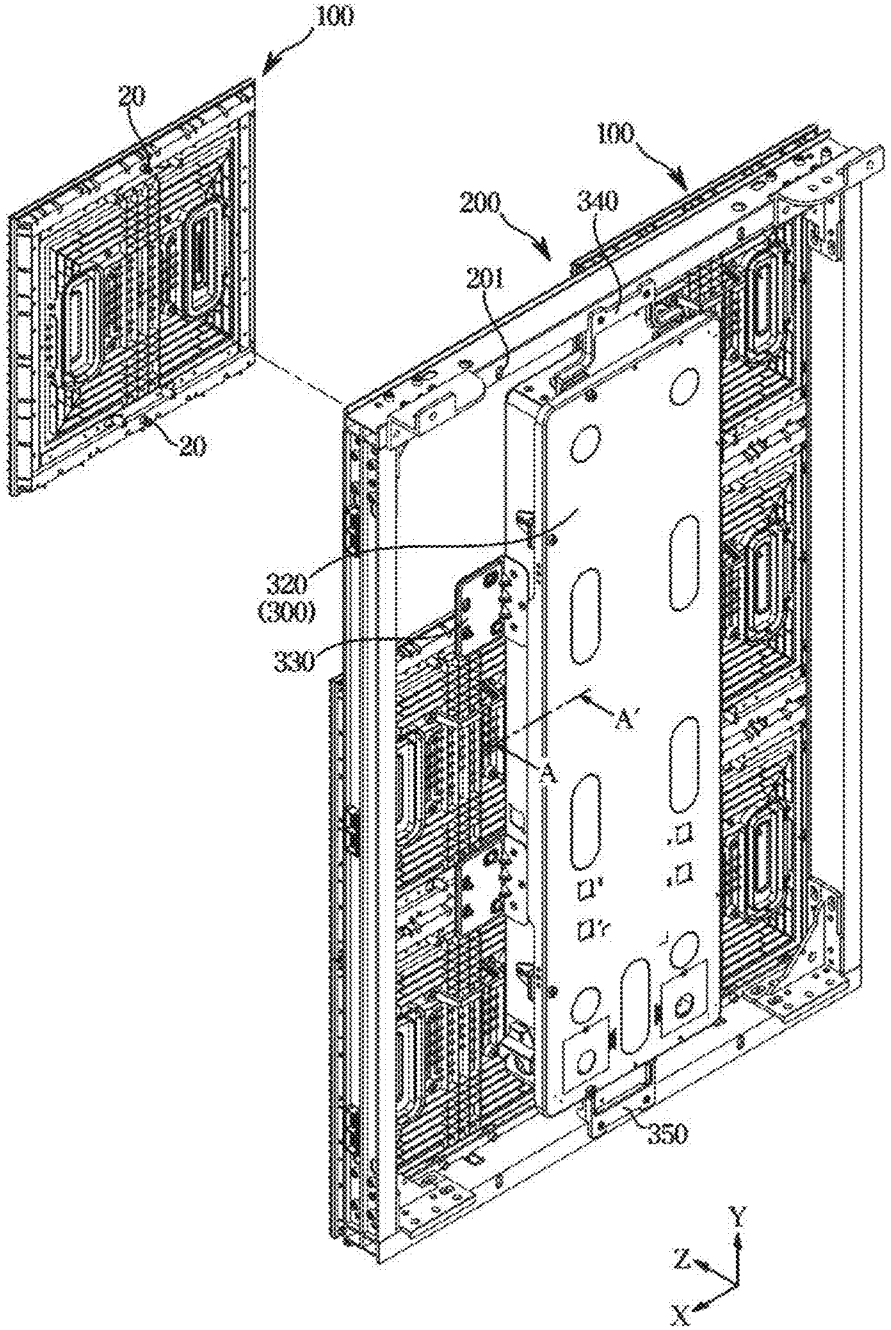
FIG. 3 is a rear perspective view illustrating the display apparatus according to an embodiment, with the cabinet and the display module separated from the cabinet.
Figure 4:
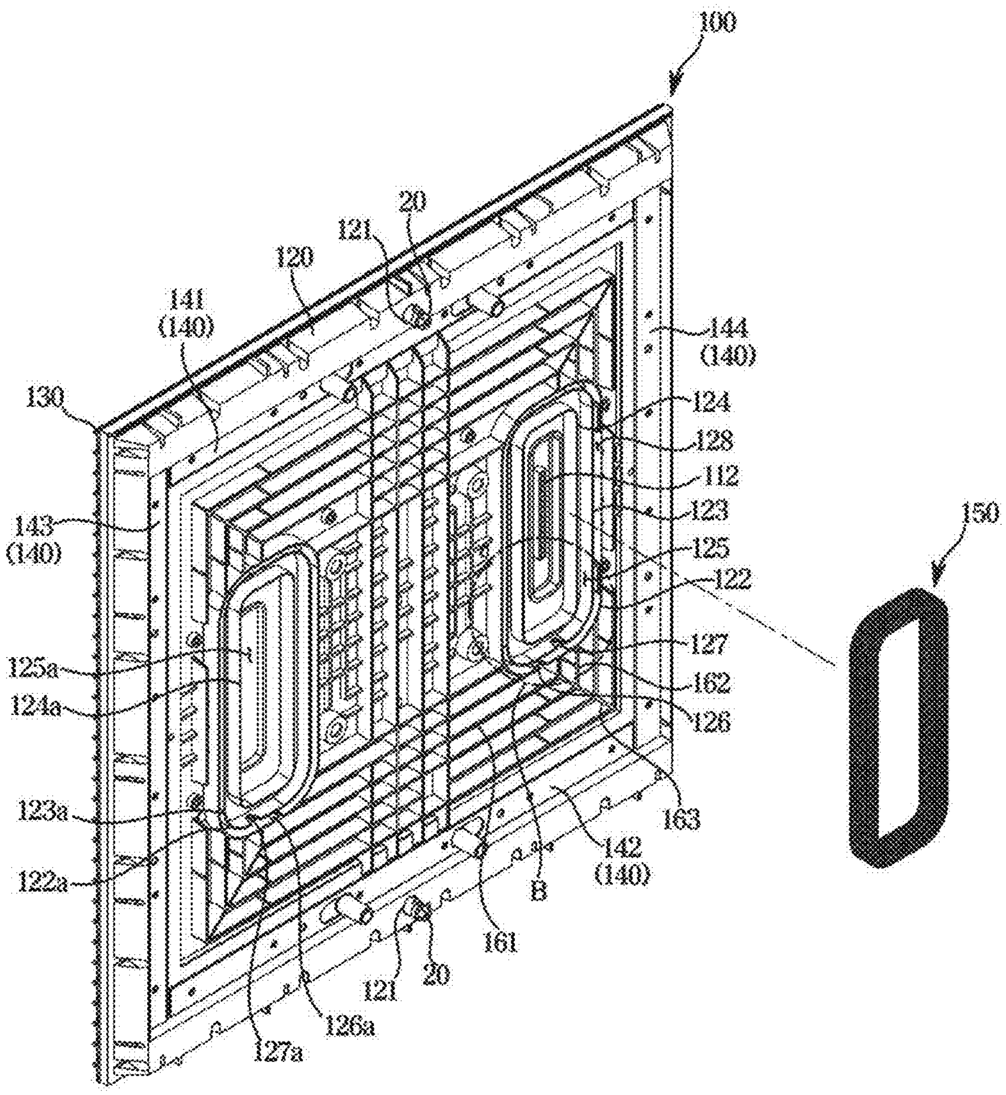
FIG. 4 is a rear perspective view of the display module in the display apparatus according to an embodiment.

FIG. 3 is a rear perspective view illustrating the cabinet and the display module separated from the cabinet in the display apparatus according to an embodiment. FIG. 4 is a rear perspective view of the display module in the display apparatus according to an embodiment.

Referring to FIG. 3, the display module 100 may be separated to the front side of the cabinet 200. As described above, the display module 100 may be coupled to the cabinet 200 by magnetic forces. A plurality of magnets 10 (see FIG. 2) may be arranged on the front surface of the cabinet 200, and the reinforcing member 140 (see FIG. 5) that is attracted by the magnetic attraction of the plurality of magnets 10 may be arranged on the rear surface of the display module 100.

Figure 5:
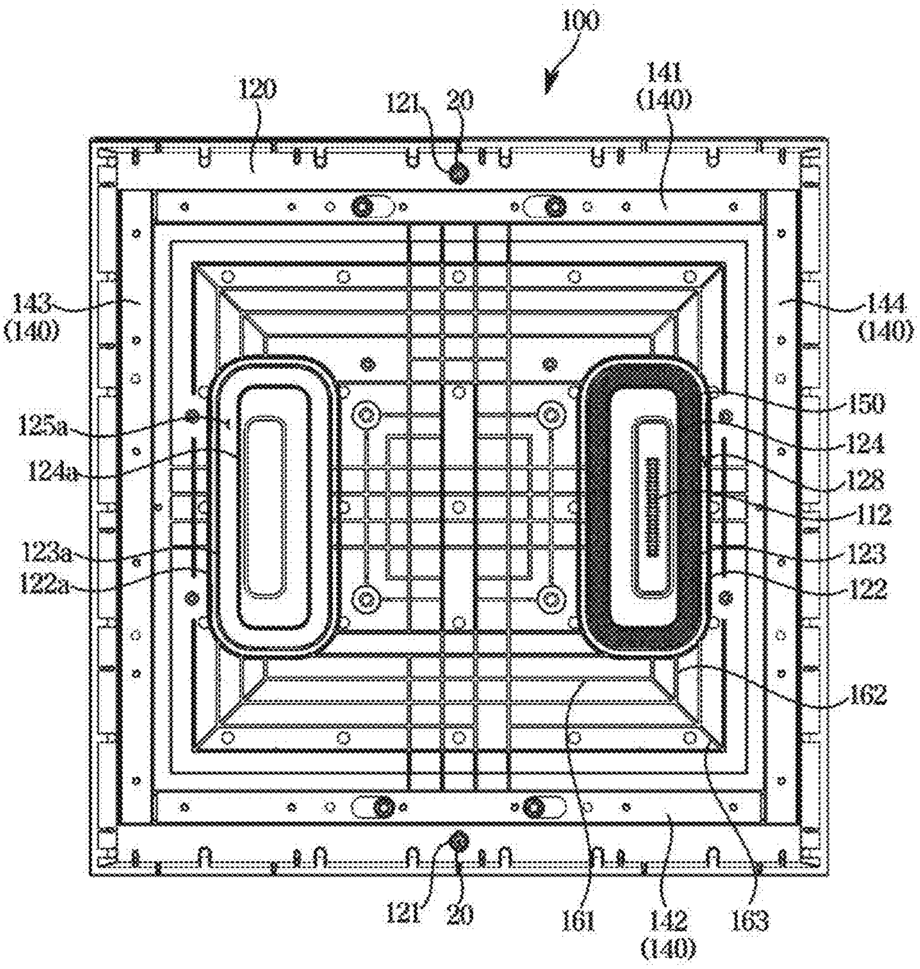
FIG. 5 is a rear plan view of the display module of the display apparatus according to an embodiment.

FIG. 4 is a rear perspective view of the display module in the display apparatus according to an embodiment. FIG. 5 is a rear plan view of the display module in the display apparatus according to an embodiment.

Referring to FIG. 4, the display module 100 may include a first drainage hole 126 arranged on a lower portion of a first waterproof rib 122 and a second drainage hole 127 arranged on a lower portion of a second waterproof rib 123.

The first drainage hole 126 may be formed by cutting a portion of the first waterproof rib 122, and the second drainage hole 127 may be formed by cutting a portion of the second waterproof rib 123. Alternatively, the first drainage hole 126 may be formed by penetrating a portion of the first waterproof rib 122, and similarly, the second drainage hole 127 may be formed by penetrating a portion of the second waterproof rib 123. The first drainage holes 126 may be formed in a plurality in the first waterproof rib 122. The second drainage holes 127 may be formed in a plurality in the second waterproof rib 123.

Referring to FIG. 5, the reinforcing member 140 may be coupled to the rear surface of a holder 120. The reinforcing member 140 may be arranged on a border of a rear surface of the holder 120. The reinforcing member 140 may include a first reinforcing member 141, a second reinforcing member 142, a third reinforcing member 143, and a fourth reinforcing member 144. The first reinforcing member 141 may be arranged adjacent to an upper edge of the rear surface of the holder 120 and may extend in a horizontal direction. The second reinforcing member 142 may be arranged adjacent to a lower edge of the rear surface of the holder 120 and may extend in the horizontal direction. The third reinforcing member 143 may be arranged adjacent to a left edge of the rear surface of the holder 120 and may extend in a vertical direction. The fourth reinforcing member 144 may be arranged adjacent to a right edge of the rear surface of the holder 120 and may extend in the vertical direction.

The reinforcing member 140 may increase the rigidity of the display module 100 by being coupled to the rear surface of the holder 120. The reinforcing member 140 may prevent the display module 100 from bending.

The reinforcing member 140 may be formed of a material that is attracted by the magnetic force of the magnet 10 (see FIG. 2). The reinforcing member 140 may be formed of a material that may be magnetized by an external magnetic force. The reinforcing member 140 may be mutually attracted to the magnet 10 by the polarity obtained by the reinforcing member 140 by the external magnetic force. The reinforcing member 140 may be configured to include a magnetic material that interacts with the magnet 10. The reinforcing member 140 may be configured to include iron (Fe).

The display module 100 may include a fastener 20. The fastener 20 may be provided on the upper and lower sides of the rear surface of the display module 100. According to an embodiment, the fastener 20 may be arranged at the upper center and the lower center of the rear surface of the display module 100, respectively, but there is no limit to such locations.

The fastener 20 may prevent the display module 100 from being separated from the cabinet 200. The display module 100 may be coupled to the cabinet 200 by the magnetic attraction between the plurality of magnets 10 and the reinforcing member 140. However, in response to a force greater than the magnetic attraction being applied to cause the display module 100 to separate from the cabinet 200, the display module 100 may be separated from the cabinet 200. To prevent such a situation, the fastener 20 may be configured to prevent the display module 100 from moving forwardly of the cabinet 200.

The display module 100 may include the first waterproof rib 122, the second waterproof rib 123, and a third waterproof rib 124, which protrude rearwardly from the rear surface of the holder 120. A sealing groove 125 (see FIG. 7) may be formed between the second waterproof rib 123 and the third waterproof rib 124, and a sealing member 150 may be provided in the sealing groove 125. A waterproof groove 128 may be formed between the first waterproof rib 122 and the second waterproof rib 123.

The waterproof groove 128 may be configured to allow water entering from the outside to flow so as not to pass through the sealing member 150. Because the waterproof groove 128 is formed to be much larger than a gap between the circuit case 300 and the first waterproof rib 122, the water flows down the waterproof groove 128 by gravity rather than moving along the circuit case 300 by capillary action. The waterproof groove 128 may be formed deeper than the sealing groove 125 to prevent the inflowing water from entering the sealing groove 125. At high flow rates, if the waterproof groove 128 is formed shallowly, the amount of water entering the sealing groove 125 may increase.

The number of waterproof ribs 122, 123 and 124 may be increased. The more waterproof ribs 122, 123 and 124, the less water may reach the sealing groove 125. In response to the waterproof ribs 122, 123 and 124 being formed in greater numbers, the drainage holes 126 and 127 formed at the lower portion of each waterproof rib may also be formed in greater numbers. The waterproof grooves 128 formed between the waterproof ribs 122, 123 and 124 may also be formed in greater numbers in response to the waterproof ribs 122, 123 and 124 being formed in greater numbers. The greater the number of waterproof grooves 128, the greater the amount of water that moves downward by gravity along the waterproof grooves 128 without reaching the sealing groove 125 that receives the sealing member 150. The waterproof grooves 128 may be formed to be deeper as they are formed further outwardly. In other words, the waterproof grooves 128 may be formed to be deeper than the sealing groove 125. The deeper the waterproof grooves 128, the more the number of sealing grooves and waterproof grooves may be formed, although only one sealing groove and one waterproof groove are shown herein, but they are not limited thereto.

The first waterproof rib 122, the second waterproof rib 123, and the third waterproof rib 124 may each be provided in a ring shape. The first waterproof rib 122, the second waterproof rib 123, and the third waterproof rib 124 may each be configured to surround the first connector 112 connecting the display module 100 and the circuit case 300. The first waterproof rib 122, the second waterproof rib 123, and the third waterproof rib 124 may each be formed to be spaced outwardly around the first connector 112. The second waterproof rib 123 may be arranged on the inner side of the first waterproof rib 122, and the third waterproof rib 124 may be arranged on the inner side of the second waterproof rib 123.

The first to third waterproof ribs 122, 123 and 124 may contact the front side of the circuit case 300 to prevent moisture from entering the inner side of the first to third waterproof ribs 122, 123 and 124 from the outer side of the first to third waterproof ribs 122, 123 and 124. The waterproof ribs 122, 123 and 124 may be formed in greater numbers. The greater the number of waterproof ribs 122,

123 and 124, the less the amount of water reaching the sealing groove 125 in which the sealing member 150 is received.

The sealing member 150 may be provided in the sealing groove 125 formed between the second waterproof rib 123 and the third waterproof rib 124. The sealing member 150 may be arranged to surround the first connector 112. The sealing member 150 may be formed to correspond to the shape of the sealing groove 125. The sealing member 150 may be provided in an approximately ring shape. The sealing member 150 may be made of a material capable of changing volume, and may be configured to include, for example, rubber.

According to an embodiment, the sealing member 150 may be attached to the rear surface of the display module 100, but is not limited thereto. The sealing member 150 may also be attached to the front surface of the circuit case 300 so as to correspond to the sealing groove 125.

The display module 100 may include a first waterproof rib 122*a*, a second waterproof rib 123*a*, a third waterproof rib 124*a*, and a sealing groove 125*a* arranged symmetrically from side to side with the first waterproof rib 122, the second waterproof rib 123, the third waterproof rib 124, and the sealing groove 125. For ease of description, the first to third waterproof ribs 122*a*, 123*a* and 124*a* may be referred to as left waterproof ribs, and the first to third waterproof ribs 122, 123 and 124 may be referred to as right waterproof ribs.

The left waterproof ribs 122*a*, 123*a* and 124*a* and the right waterproof ribs 122, 123 and 124 may be provided in the same symmetrical configurations from side to side. This is to allow the display module 100 to be coupled to at least one of the left or right column of the two columns of the cabinet 200. For example, in response to the display module 100 being coupled to the right column of the cabinet 200, the first connector 112 may be arranged on the inner side of the right waterproof rib 122, 123 and 124, and the sealing member 150 may be provided in the right sealing groove 125 to prevent water from entering the first connector 112.

Conversely, in response to the display module 100 being coupled to the left column of the cabinet 200, the first connector 112 may be arranged on the inner side of the left rib 122*a*, 123*a* and 124*a*, and the sealing member 150 may be provided in the left sealing groove 125*a*. In addition, no opening may be provided on the inner side of the waterproof rib in which the first connector 112 is not arranged.

The display module 100 may further include guide ribs 161, 162 and 163 configured to guide a flow of water for dispersion. The guide ribs 161, 162 and 163 may include a first guide rib 161, a second guide rib 162, and a third guide rib 163. The guide ribs 161, 162 and 163 may each be formed in a plurality, and may each be formed at a predetermined interval. The guide ribs 161, 162 and 163 may be formed entirely on the rear surface of the display module 100 for structural stability of the display module 100. The guide ribs 161, 162 and 163 may also be formed on a lower side of the waterproof ribs 122, 123 and 124 to disperse the draining water.

Referring to FIG. 5, no opening may be provided on the inner side of the left third waterproof rib 124*a*, and an opening may be provided on the inner side of the right third waterproof rib 124 to allow the first connector 112 to be exposed.

Below, for ease of description, the right waterproof ribs 122, 123 and 124 and the right sealing groove 125 will be referred to as the waterproof ribs 122, 123 and 124 and sealing groove 125.

Figure 6:
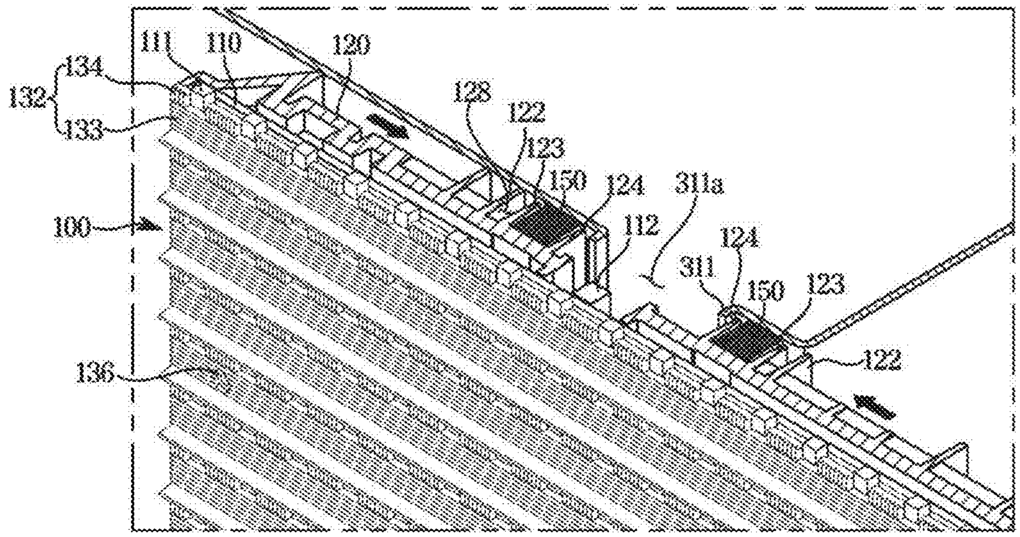
FIG. 6 is a cross-sectional perspective view taken along line A-A' of FIG. 3.
Figure 7:
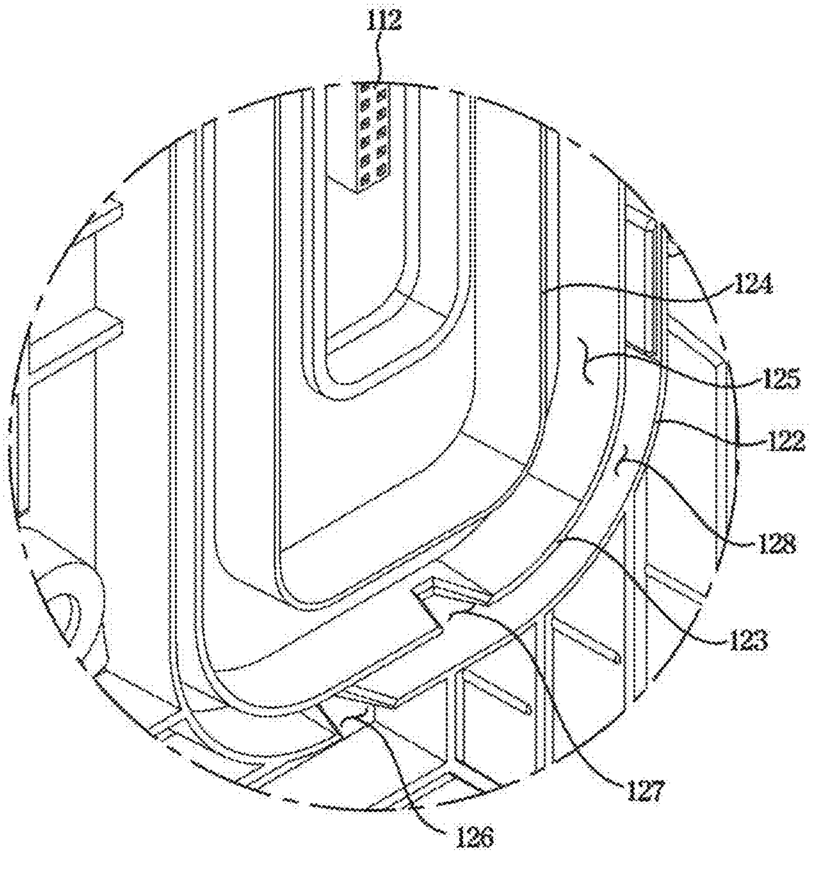
FIG. 7 is an enlarged view of portion B of FIG. 5.
Figure 8:
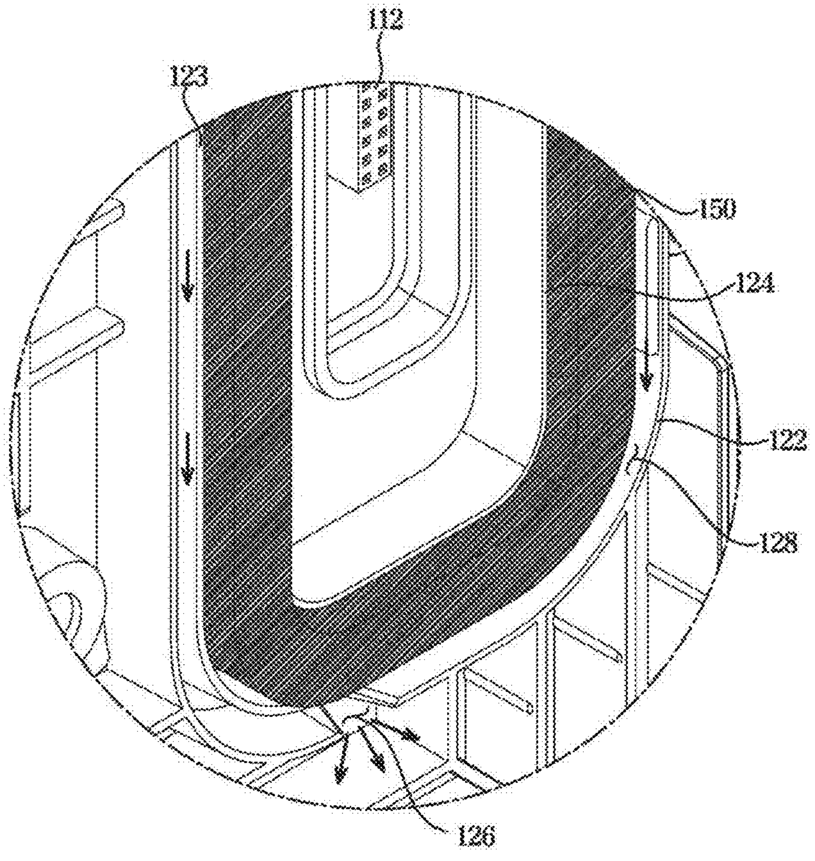
FIG. 8 is a view illustrating channels a drainage path around a waterproof area of the display module according to an embodiment.

FIG. 6 is a cross-sectional perspective view taken along line A-A' of FIG. 3. FIG. 7 is an enlarged view of portion B of FIG. 4. FIG. 8 is a view showing a drainage path around a waterproof area of the display module according to an embodiment.

Referring to FIG. 6, a structure for blocking water ingress will be described in detail when the display module 100 is coupled to the cabinet 200.

In response to the display module 100 being coupled to the cabinet 200, the sealing member 150 may be in contact with the front surface of the first case 310. The sealing member 150 may seal between the front surface of the first case 310 and the rear surface of the holder 120 by contacting the front surface of the first case 310 and the rear surface of the holder 120. In response to the display module 100 being coupled to the cabinet 200, the sealing member 150 may prevent water from entering from the outer side of the sealing member 150 to the inner side of the sealing member 150. As such, the sealing member 150 may be configured to seal between the display module 100 and the circuit case 300 when the display module 100 and the circuit case 300 are coupled.

The display apparatus 1 may include the first waterproof rib 122, the second waterproof rib 123, the third waterproof rib 124, the sealing member 150, and a rib 311 for blocking water ingress into the interior of the display module 100 where the first connector 112 is located and into the interior of the circuit case 300 where the second connector 301 is located.

The display module 100 may block water ingress into the interior of the display module 100 by blocking water from entering through the opening formed on the inner side of the third waterproof rib 124. In other words, the display module 100 may be arranged to block water ingress except for an opening that allows the first connector 112 to be exposed to the outside. The circuit case 300 may block water ingress into the interior of the circuit case 300 by blocking water from entering through a case opening 311*a*. In other words, the circuit case 300 may be configured to block moisture from entering except for the case opening 311*a* that allows the second connector 301 to be exposed to the outside. Accordingly, by sealing the opening inside the third waterproof rib 124 of the display module 100 and the case opening 311*a* of the circuit case 300, water ingress into the display apparatus 1 may be blocked.

In order for water to enter the interior of the display apparatus 1 where the first connector 112 and the second connector 301 are located, as indicated by the arrows in FIG. 7, the water must pass through the first waterproof rib 122, the second waterproof rib 123, the sealing member 150, the third waterproof rib 124, and the rib 311 from the outside of the first waterproof rib 122. In other words, since the first waterproof rib 122, the second waterproof rib 123, the sealing member 150, the third waterproof rib 124, and the rib 311 are arranged on the water inflow path, it is difficult for water to pass through such structures and enter the interior of the display apparatus 1, thereby improving the waterproof performance of the display apparatus 1.

The waterproof ribs 122, 123 and 124 may be formed at the same height as the sealing member 150 so as to be in contact with the circuit case 300 when the display module 100 and the circuit case 300 are coupled. The waterproof ribs 122, 123 and 124 may be formed to be in contact with the circuit case 300, so that the amount of water entering a waterproof area may be reduced, which may improve the waterproof performance.

The guide ribs 161, 162 and 163 may be formed at the same height as the sealing member 150 so as to be in contact with the circuit case 300 when the display module 100 and the circuit case 300 are coupled. The guide ribs 161, 162 and 163 may be formed to be in contact with the circuit case 300, so that the amount of water entering the waterproof area may be reduced, which may improve the waterproof performance.

In addition, the display apparatus 1 may prevent water from entering the interiors of the display module 100 and the circuit case 300 by sealing only a portion of the rear surface of the display module 100 and a portion of the front surface of the circuit case 300.

As described above, the display module 100 may be configured to be waterproof by blocking water from entering the opening formed on the inner side of the third waterproof rib 124. The circuit case 300 may be configured to be waterproof by blocking water from entering the case opening 311*a*. Accordingly, the display apparatus 1 may be made waterproof by sealing only a partial area of the rear surface of the display module 100 and a partial area of the front surface of the circuit case 300 corresponding thereto. The partial area may refer to an area on the inner side of the sealing member 150. The first to third waterproof ribs 122, 123 and 124, the sealing member 150, and the rib 311 may block water from entering the inner side of the sealing member 150, and the area on the inner side of the sealing member 150 may be relatively small in area, thereby effectively blocking moisture from entering. In other words, by reducing the area that needs to be waterproofed, the waterproofing performance may be improved. Furthermore, by reducing the area that needs to be waterproofed, the risk of water ingress into the area that needs to be waterproofed may be reduced.

Referring to FIG. 8, the first drainage hole 126 may be arranged on the lower end of the first waterproof rib 122, and the second drainage hole 127 may be arranged on the lower end of the second waterproof rib 123. The first drainage hole 126 may be configured to drain water flowing along the waterproof groove 128. The second drainage hole 127 may be configured to drain water flowing along the sealing groove 125.

The second drainage hole 127 may be positioned at the lower portion of the second waterproof rib 123 to drain water because if the water existing in the sealing groove 125 is not drained, additional water inflow may increase the possibility of water ingress into the interior of the sealing member 150. The first drainage hole 126 may be positioned at the lower portion of the first waterproof rib 122 to drain water because if water existing in the waterproof groove 128 is not drained, additional water inflow may increase the possibility of water ingress into the interiors of the sealing groove 125 and the sealing member 150.

The first drainage hole 126 and the second drainage hole 127 may be arranged to be spaced apart in the vertical direction and the left-and-right direction so as not to overlap in the vertical direction. In other words, the first drainage hole 126 may not be aligned with the second drainage hole 127 in the vertical direction.

Such a structure is designed to prevent moisture from entering the first connector 112 through the first drainage hole 126 and the second drainage hole 127. In a case where the first drainage hole 126 and the second drainage hole 127 are positioned to overlap each other in the vertical direction, the water inflow path from below the first drainage hole 126 through the first drainage hole 126 and the second drainage hole 127 to the sealing groove 125 may be simplified, which may increase the possibility of water entering the sealing groove 125. In a case where the first drainage hole 126 and the second drainage hole 127 are positioned to be spaced apart from each other in the left-and-right direction, water entering through the first drainage hole 126 may first move laterally and then upwardly before passing through the second drainage hole 127. Accordingly, the water inflow path through the first drainage hole 126 and the second drainage hole 127 to the sealing groove 125 may be complicated, which may reduce the possibility of water entering the sealing groove 125. Although the sealing member 150 is arranged to block moisture from entering the interiors of the sealing groove 125 and the third waterproof rib 124, it is desirable to reduce the amount of moisture entering the sealing member 150 in order to improve the waterproof performance of the display module 100.

In addition, such a structure is designed to prevent the water discharged from the second drainage hole 127 from directly draining into the first drainage hole 126. In a case where the water discharged from the second drainage hole 127 is directly drained into the first drainage hole 126, the downward flow rate may increase, which may reduce the function of the guide ribs 161, 162 and 163, and the flow rate to the display module 100 located below may not be reduced. Accordingly, the first drainage hole 126 and the second drainage hole 127 may be arranged to be spaced apart in the left-and-right direction and in the up-and-down direction.

Below, for ease of description, the right waterproof ribs 122, 123 and 124 and the right sealing groove 125 will be referred to as the waterproof ribs 122, 123 and 124 and the sealing groove 125.

Referring to FIG. 8, the arrows shown indicate the drainage path. As shown in FIG. 7, water may be forced to pass through the first waterproof rib 122, the second waterproof rib 123, the sealing member 150, the third waterproof rib 124, and the rib 311 from the outside of the first waterproof rib 122. A portion of the water passing through the first waterproof rib 122 may flow down along the waterproof groove 128 and then drain downward through the first drainage hole 126. A portion of the water passing through the second waterproof rib 123 may flow down along the sealing groove 125, drain downward through the second drainage hole 127, and then drain downward through the first drainage hole 126. Water drained through the first drainage hole 126 may flow down along the guide ribs 161, 162 and 163.

The guide ribs 161, 162 and 163 may include the first guide rib 161 that guides water to move in the left-and-right direction. The first guide ribs 161 may be formed to be spaced apart from each other. The first guide rib 161 may guide water flowing in the display module 100 in the left-and-right direction, thereby reducing the flow rate in the up-and-down direction and distributing the water left-and-right. The first guide rib 161 may be formed at a predetermined distance from the drainage holes 126 and 127 in the up-and-down direction so that water flowing out of the drainage hole 126 and 127 is guided in the left-and-right direction.

The guide ribs 161, 162 and 163 may include the second guide rib 162 that guides the water to move in the up-and-down direction. The second guide rib 162 may be formed perpendicular to the first guide rib 161. The second guide ribs 162 may be formed to be spaced apart from each other. The second guide ribs 162 may prevent the water flowing in the display module 100 from flowing excessively in the left-and-right direction and may guide the water in the up-and-down direction to allow the water to be drained smoothly by gravity.

The guide ribs 161, 162 and 163 may include the third guide rib 163 extending along an inclined direction from the first guide rib 161 and the second guide rib 162. The third guide rib 163 may be formed along a portion where the first guide rib 161 and the second guide rib 162 intersect. The third guide rib 163 may distribute water so that water flowing in the display module 100 is not concentrated in a particular portion. The third guide rib 163 may be positioned below the drainage holes 126 and 127 to disperse water flowing out of the drainage holes 126 and 127.

Water drained from the drainage holes 126 and 127 may be dispersed downward along the guide ribs 161, 162 and 163. By dispersing the water, the amount of water flowing to the display module 100 positioned below may be reduced, so that the waterproof performance of the display module 100 positioned below may be further improved.

Figure 9:
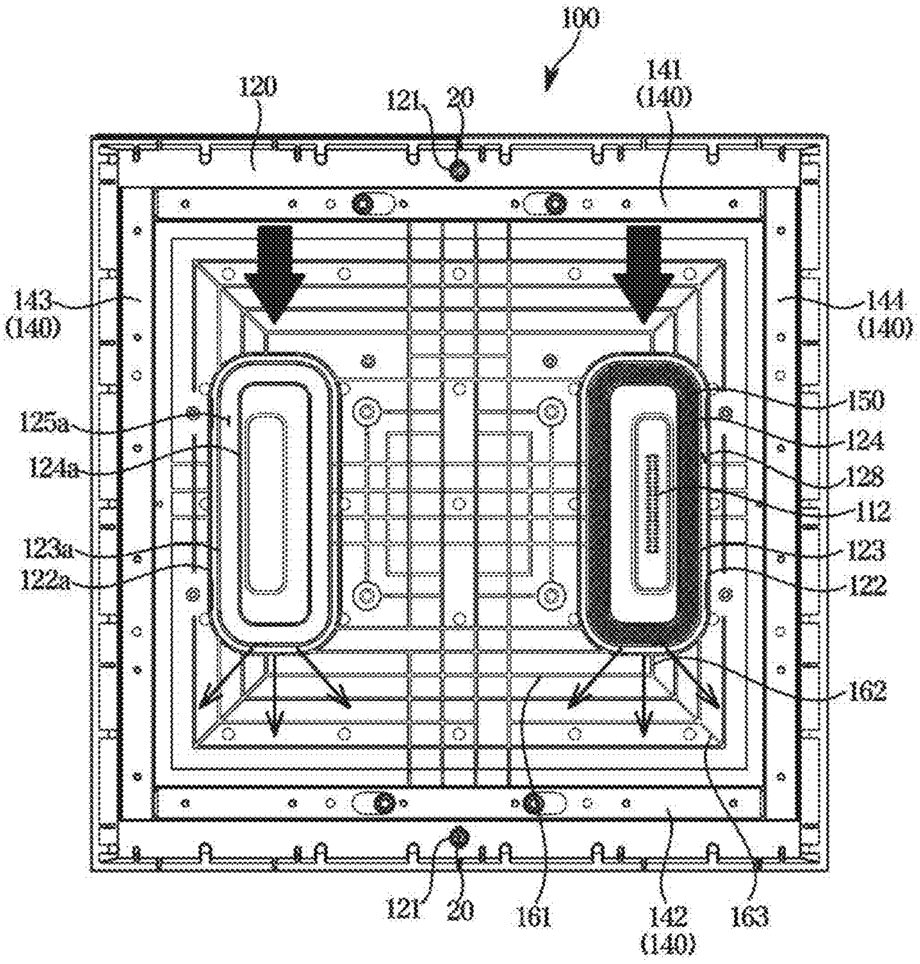
FIG. 9 is a plan view illustrating the drainage path in the display module of the display apparatus according to an embodiment.
Figure 10:
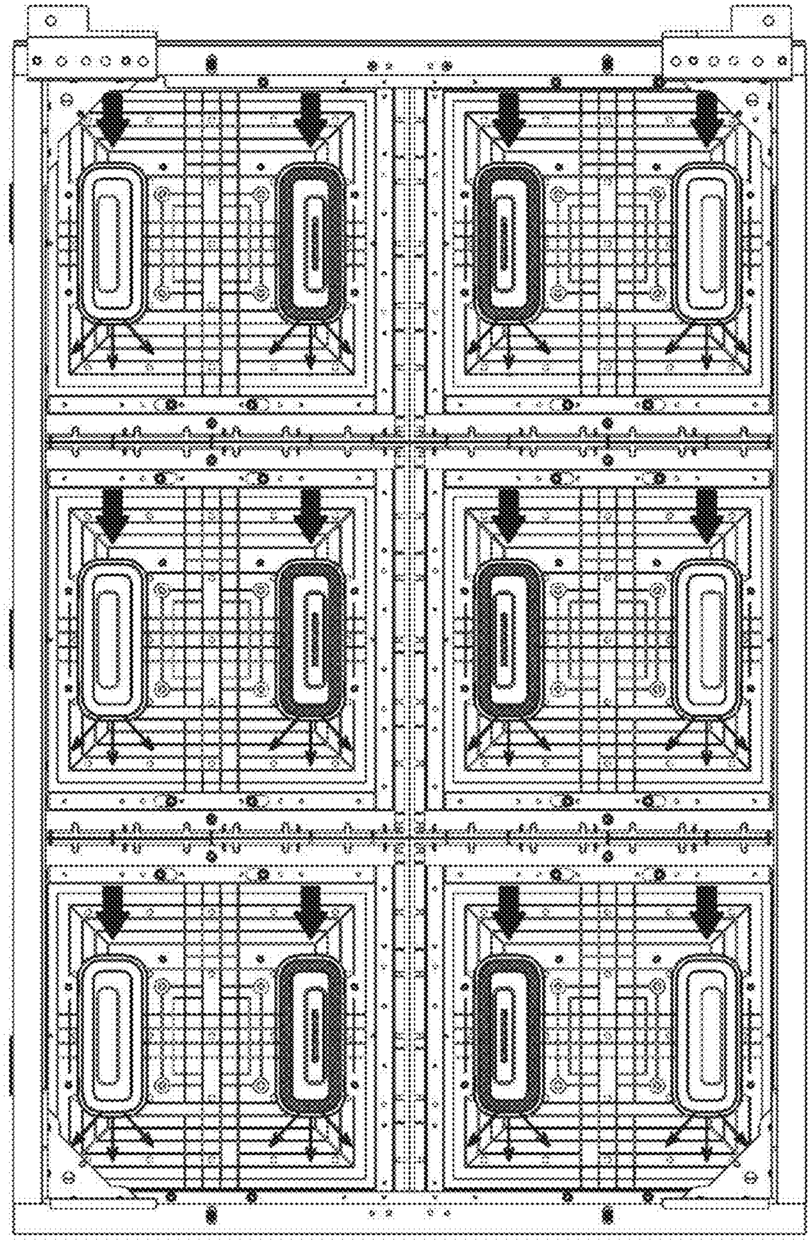
FIG. 10 is a plan view of the drainage path of the display apparatus according to an embodiment.

FIG. 9 is a view illustrating the drainage path on the rear surface of the display module. FIG. 10 is a view illustrating the drainage path of the display apparatus in a state where the plurality of display modules are coupled to the cabinet.

Referring to FIGS. 9 and 10, the arrows shown indicate the drainage paths.

Referring to FIG. 9, water entering the display module 100 may flow downward by gravity except for the waterproof area, i.e., the area where the sealing member 150 and waterproof ribs 122, 123 and 124 are formed. The water may flow downward by the guide ribs 161, 162 and 163 of the display module 100, but may flow in the left-and-right direction and be dispersed.

In the waterproof area of the display module 100, water may flow along the waterproof groove 128 and the sealing groove 125 and drain through the drainage holes 126 and 127 as shown in FIG. 8.

Referring to FIG. 10, the display module 100 may be arranged in the left-and-right direction and in the up-and-down direction and be coupled to the cabinet. The water flowing in the display module 100 arranged at the uppermost, as described in FIG. 9, may flow downward essentially by gravity, but is dispersed in the left-and-right direction by the guide ribs 161, 162 and 163.

Since the water flowing from the display module 100 positioned above is dispersed and introduced into the display module 100 positioned below, the absolute amount of flow reaching the waterproof area, i.e., the area where the waterproof ribs 122, 123 and 124 and the sealing member 150 are arranged, may be reduced.

By arranging the plurality of cabinets 200 in which the plurality of display modules 100 are coupled adjacent to each other in the left-and-right direction X and the up-and-down direction Y, the flow rate may be dispersed rather than concentrated even when the large size display apparatus 1 is formed. As a result, the amount of water reaching the display module 100 positioned below may be small.

Although certain exemplary embodiments are illustrated and described above, the present disclosure is not limited to the certain embodiments, various applications may of course be performed by those skilled in the art without deviating from what is claimed in the scope of claims, and such applications should not be understood separately from the technical idea or prospects herein.

What is claimed is:

1. A display apparatus comprising:
- a display module comprising a substrate and a plurality of light-emitting diodes (LEDs) mounted on the substrate;
- a cabinet configured to support the display module; and
- a circuit case coupled to the cabinet,
- wherein the display module further comprises:
  - a connector electrically connecting the display module and the circuit case;
  - a waterproof rib around the connector and spaced apart from the connector;
  - a sealing member around the connector and configured to seal between the display module and the circuit case in a state in which the display module is coupled to the circuit case; and
  - a drainage hole in a lower portion of the waterproof rib.

2. The display apparatus of claim 1, wherein the waterproof rib comprises:
- a first waterproof rib; and
- a second waterproof rib positioned on an inner side of the first waterproof rib,
- wherein the display module further comprises a waterproof groove between the first waterproof rib and the second waterproof rib.

3. The display apparatus of claim 2, wherein the display module comprises a sealing groove between the second waterproof rib and a third waterproof rib and spaced apart from an inner side of the second waterproof rib, the sealing groove receiving the sealing member.

4. The display apparatus of claim 3, wherein the waterproof groove is deeper than the sealing groove.

5. The display apparatus of claim 3, wherein the first waterproof rib comprises a first drainage hole on a first lower portion of the first waterproof rib and configured to discharge water flowing along the waterproof groove, and
- wherein the second waterproof rib comprises a second drainage hole on a second lower portion of the second waterproof rib and configured to discharge the water flowing along the sealing groove.

6. The display apparatus of claim 5, wherein the second drainage hole is spaced apart from the first drainage hole in an up-and-down direction and a left-and-right direction.

7. The display apparatus of claim 1, wherein the display apparatus further comprises a guide rib configured to guide water to be dispersed.

8. The display apparatus of claim 7, wherein the guide rib comprises:
- a first guide rib extending in a left-and-right direction and configured to guide the water in the left-and-right direction; and
- a second guide rib perpendicular to the first guide rib, extending in an up-and-down direction, and configured to guide the water in the up-and-down direction.

9. The display apparatus of claim 8, wherein the first guide rib is spaced apart from the drainage hole and configured to guide the water discharged from the drainage hole in the left-and-right direction, and
- wherein the second guide rib is perpendicular to the first guide rib and configured to guide the water in the up-and-down direction with the first guide rib.

10. The display apparatus of claim 9, wherein the guide rib further comprises a third guide rib extending in an inclined direction with the first guide rib and the second guide rib.

11. The display apparatus of claim 10, wherein the third guide rib passes through a portion where the first guide rib and the second guide rib intersect.

12. The display apparatus of claim 11, wherein the third guide rib is positioned below the drainage hole to guide the water discharged from the drainage hole.

13. The display apparatus of claim 1, further comprising a plurality of display modules comprising the display module, wherein the plurality of display modules are arranged in a left-and-right direction and an up-and-down direction, and are coupled to the cabinet.

* * * * *